United States Patent [19]
Herring et al.

[11] Patent Number: 5,581,190
[45] Date of Patent: Dec. 3, 1996

[54] METHOD AND APPARATUS FOR TESTING RF DEVICES

[75] Inventors: Chauncey Herring; Michael S. Heutmaker, both of Trenton; Eleanor Wu, Princeton, all of N.J.

[73] Assignee: Lucent Technologies Inc., Murray Hill, N.J.

[21] Appl. No.: 434,875

[22] Filed: Apr. 29, 1995

[51] Int. Cl.$^6$ .................................................. G01R 27/00
[52] U.S. Cl. ............................................ 324/605; 324/613
[58] Field of Search ................................. 324/605, 76.23, 324/85, 613, 622; 455/226.1, 62, 63, 67.1

[56] References Cited

U.S. PATENT DOCUMENTS

| | | | |
|---|---|---|---|
| 5,179,344 | 1/1993 | Najle et al. | 324/622 |
| 5,297,203 | 3/1994 | Rose et al. | 379/61 |
| 5,337,014 | 8/1994 | Najle et al. | 324/613 |
| 5,371,783 | 12/1994 | Rose et al. | 455/62 |
| 5,487,186 | 1/1996 | Scarpa | 455/192.2 |

OTHER PUBLICATIONS

M. Faulkner and M. Johansson,"Adaptive Linearization Using Predistortion–Experimental Results," IEEE Transactions on Vehicular Technology, vol. 43, No. 1, May 1994, pp. 323–334.

J. K. Cavers, "The Effect of Data Modulation Format on Intermodulation Power in Nonlinear Amplifiers," Proceedings of the 1994 44th IEEE Vehicular Technology Conference, vol. 1, pp. 489–493.

Hewlett–Packard 1995 Wireless Communications Design Seminar, 94 pages.

*Primary Examiner*—Michael Tokar
*Attorney, Agent, or Firm*—Robert B. Levy

[57] ABSTRACT

An RF device (12), such as an amplifier, is tested by applying a digitally-modulated RF stimulus signal, having a known magnitude and phase angle, to the device to cause it to generate a response signal. The response signal of the device is down-converted and digitized prior to establishing its magnitude and phase angle. The magnitude and phase angle of the digitized, down-converted response signal are compared to the magnitude and phase angle, respectively, of the digitally-modulated stimulus signal to yield transfer functions indicative of the operation of the device.

9 Claims, 3 Drawing Sheets

METHOD AND APPARATUS FOR TESTING RF DEVICES

TECHNICAL FIELD

This invention relates to a technique for testing an RF device, such as an RF amplifier, to assess its operating characteristics.

BACKGROUND ART

There has been a tremendous surge in the development of wireless communications systems to meet the growing need of individuals and business to communicate information without being tethered to a wire or cable. The development of wireless communications systems has prompted the development of a wide variety of RF devices for use in such systems. The testing and characterization of RF devices has been a major factor in their development. In the past, such testing has been carried out by applying an unmodulated RF earlier to the device and then receiving the response generated by the device upon receipt of the carrier. The operating characteristics of the device are assessed in accordance with the phase and magnitude of the response signal, as compared to the phase and magnitude of the input carrier.

RF testing in the manner described above incurs the disadvantage that the carrier applied to the device as the test stimulus often does not have the same characteristics as the signals supplied to the device under normal operating conditions. Modern radio systems typically employ digital modulation. Thus, the test results obtained by the use of an analog RF carrier as the test stimulus usually correlate poorly with the actual performance of the device under normal operating conditions, especially for non-linear devices.

Thus, there is a need for a technique for testing an RF device that more accurately assesses the characteristics of the device under normal operating conditions.

BRIEF SUMMARY OF THE INVENTION

Briefly, in accordance with a preferred embodiment of the invention, a technique is provided for testing an RF device, such as an RF amplifier, and particularly, for testing its linearity. To test the RF device, a digitally-modulated RF stimulus signal, having a known, time-dependent phase angle and magnitude, is applied to the device to cause it to generate a modulated RF response signal. The RF response signal generated by the device following receipt of the digitally-modulated RF stimulus signal is down-converted in frequency and thereafter digitized. The phase angle and the magnitude of the digitized, down-converted response signal are determined and compared to the phase angle and magnitude, respectively, of the RF stimulus signal to establish the operating characteristics of the device.

The test technique of the invention affords the advantage that the digitally-modulated stimulus signal closely resembles the digitally-modulated input signals that the device is likely to receive under normal operating conditions. Therefore, the operating characteristics of the device obtained by comparison of the phase angle and magnitude of the digitized, down-converted response signal to phase angle and magnitude, respectively, of the digitally-modulated stimulus signal more accurately reflect the true operation of the device.

DETAILED DESCRIPTION

Figure 1:
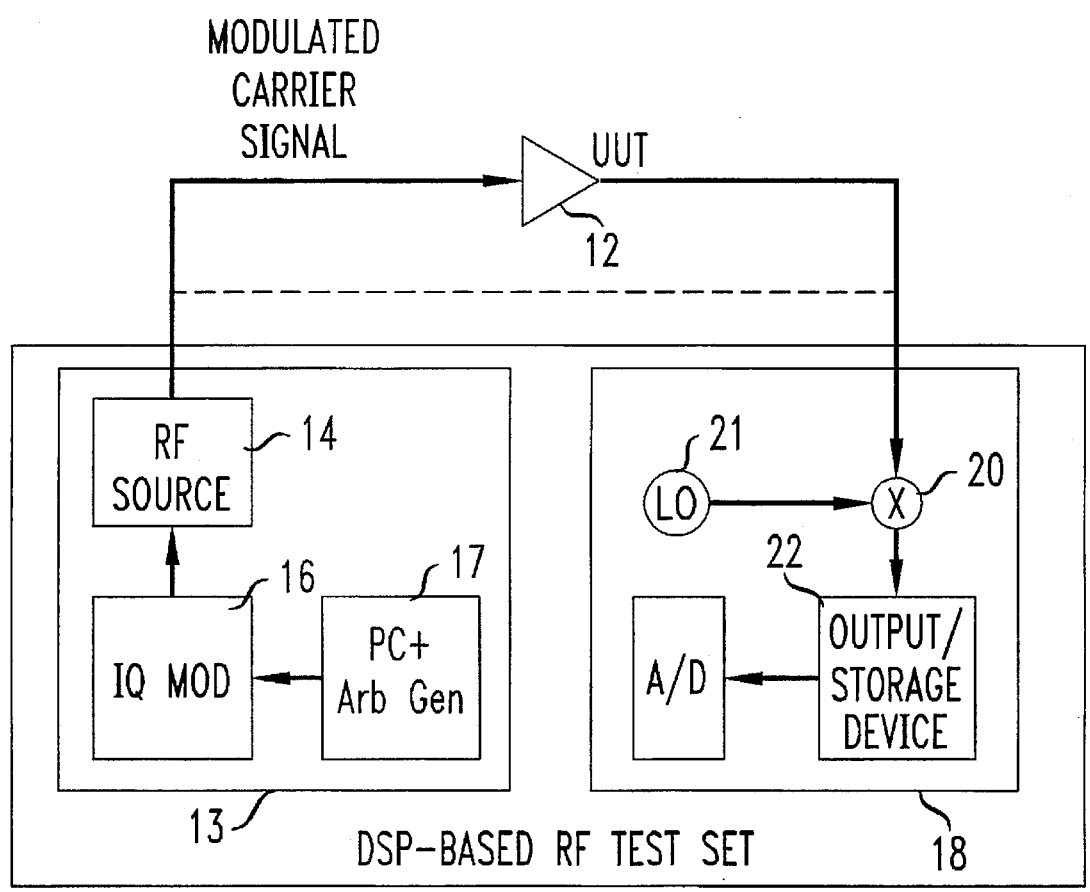
FIG. 1 shows a block schematic diagram of a system, in accordance with the invention, for testing an RF device, such as an RF amplifier.

FIG. 1 illustrates a block schematic diagram of an apparatus 10, in accordance with the invention, for testing an RF device 12. In a preferred embodiment, the RF device 12 comprises a model ZHL-1042 J amplifier manufactured by Mini-Circuits, Inc., although many other types of RF devices may be tested by the test apparatus 10. The test apparatus 10 comprises an RF stimulus generator 13 that includes an RF signal source 14 that produces an RF signal that is digitally-modulated by a modulator 16 triggered by a modulation signal generated by a signal generator 17. In a preferred embodiment, the RF signal source 14 and modulator 16 collectively comprise a Rhodes & Shwarz model SMH U58 microwave synthesizer whereas the signal generator comprises the combination of a Rhodes & Shwarz model ADS dual arbitrary signal generator, operating under the control of a personal computer (not shown) that is programmed with Rhodes & Shwarz IQSIM software.

The RF source 14 produces a digitally-modulated signal that is input to the RF device 12 under test. In response to the RF stimulus signal, the RF device 12 generates a response that is received by a test receiver 18. The receiver 18 includes a mixer 20 for down-converting the RF response signal output by the RF device 12 to a lower frequency in accordance with a reference signal from a local oscillator 21. Further, the receiver 20 includes an analog-to-digital converter 22 for digitizing the output signal of the down-converter 20, ultimately yielding the phase angle and magnitude of down-converted, digitized RF response signal. In addition, the receiver 18 includes an output device, in the form of a display screen, and/or a storage device, such as a floppy disc drive, for displaying and/or retaining information generated by the receiver. In a preferred embodiment, the receiver comprises a Hewlett-Packard model HP 89440A Vector Signal Analyzer. This particular model Vector Signal Analyzer also has a mechanism for generating a digitally modulated test stimulus. However, for accuracy purposes, we have found it more desirable to employ the RF stimulus generator 13 as described previously.

In addition to the RF stimulus generator 13, and the receiver 18, the test apparatus 10 may also include at least one processor, either in the form of the personal computer associated with the signal generator 17, or one or more separate stand-alone computers (not shown). The processor associated with the test apparatus 10 compares the phase angle and magnitude of the digitized, down-converted response signal of the RF device 12, as established by the receiver 18, to the phase angle and magnitude, respectively, of the digital stimulus produced by the RF source 14. By comparing the phase angle and magnitude of the digitized, down-converted signal of the RF device 12 to the phase angle and magnitude, respectively of the RF stimulus signal produced by the RF source 14, the processor associated with the test apparatus 10 establishes a set of transfer functions indicative of the operation of the RF device 12.

In testing the RF device 12, we have found that a Binary Phase Shift Key (BPSK) signal, comprised of a either a 1 kilobit per second or 100 kilobit per second binary signal, superimposed on a 1.6 GHz carrier, provides a useful digitally-modulated stimulus signal for testing the RF device 12. In each case, the receiver 18 samples the signal to produce 64 samples per binary phase shift key bit. Because the magnitude of the BPSK signal varies with time, the saturation characteristics of the RF device 12 can be extracted from the measurement made by the apparatus 10.

To measure the linearity characteristics of the RF device 12, the magnitude $|v_{in}(t)|$ and the phase angle $<v_{in}(t)$ of the input stimulus are first obtained. Typically, these values are obtained by feeding the output of the RF source 14 directly into the receiver 18 (as indicated by the dashed shunt across the RF device 12). Thereafter, the magnitude $|v_{out}(t)|$ and the phase angle $<v_{out}(t)$ of the response generated by the RF device 12 are established. Once the magnitudes $|v_{in}(t)|$ and $|v_{out}(t)|$ and the phase angles $<v_{in}(t)$ and $<v_{out}(t)$ have been established, then the gain g(t) of the RF device 12 can be established from the relationship:

$$g(t) = \left| \frac{v_{out}(t)}{v_{in}(t)} \right| \quad (1)$$

The phase shift $\phi(t)$ can be established from the relationship:

$$\phi(t) = <v_{out}(t) - <v_{in}(t) \quad (2)$$

Figure 2A:
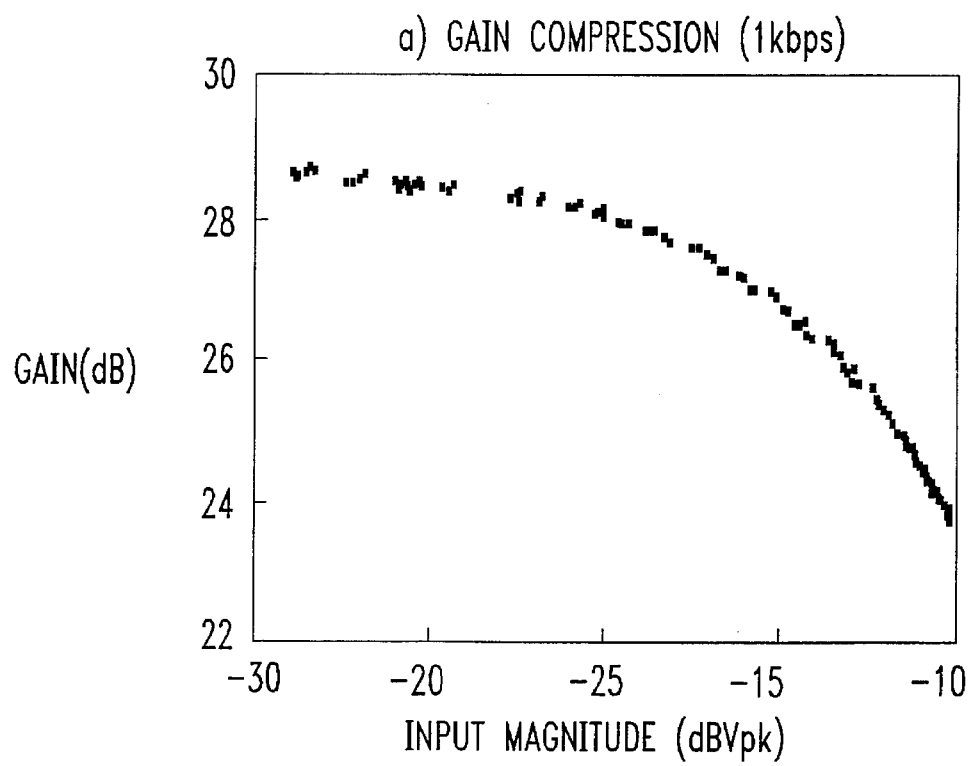
FIGS. 2A and 2B show plots of the gain compression and phase distortion, respectively, for an RF device tested by the system of FIG. 1 using a 1 kilobit per second Binary Phase Shift Key (BPSK) test stimulus.
Figure 2B:
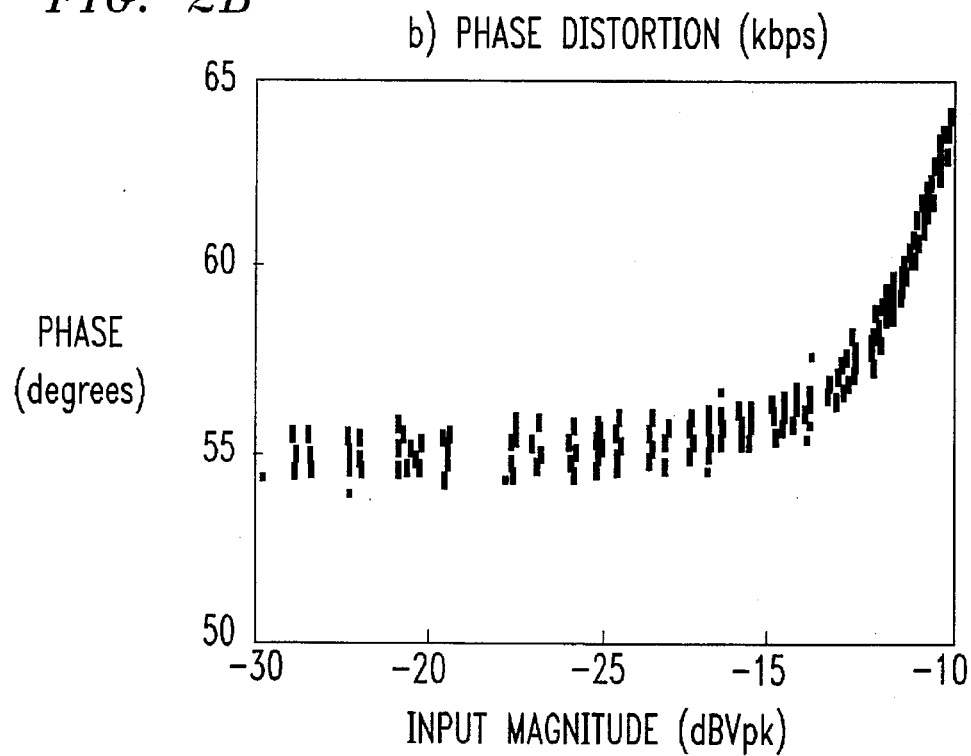
Figure 3A:
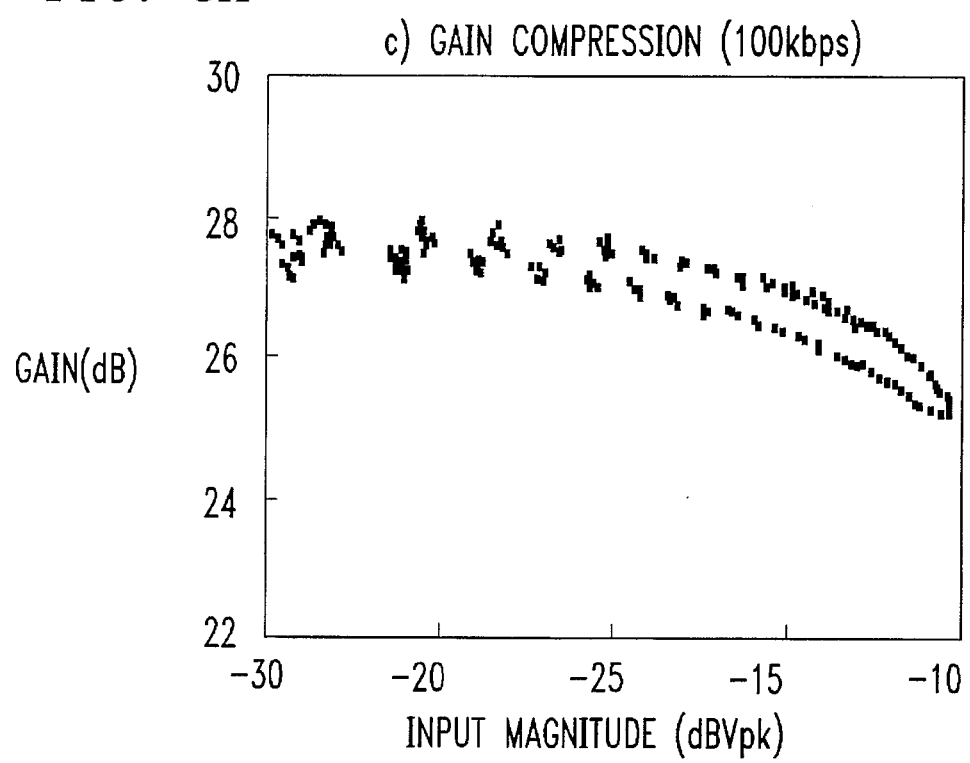
FIGS. 3A and 3B show plots of the gain compression and phase distortion, respectively, for the RF device tested by the system of FIG. 1 using a 100 kilobit per second BPSK test stimulus.
Figure 3B:
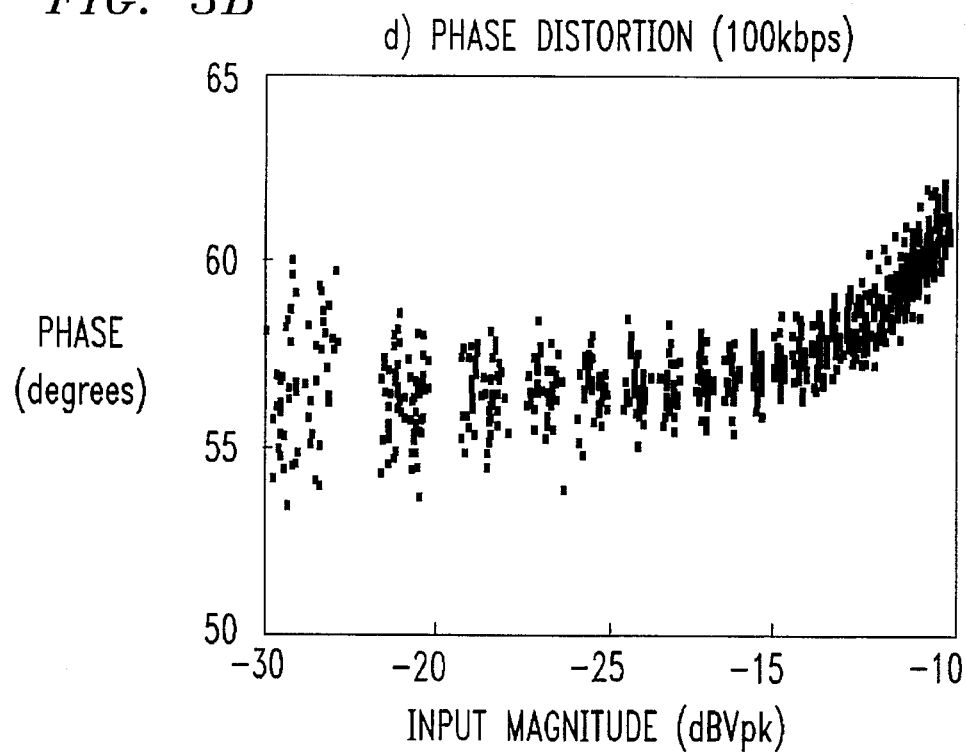

The gain g(t) and the phase shift $\phi(t)$ given by eqs. (1) and (2), respectively, can be plotted against the digitally-modulated input stimulus signal magnitude $|v_{in}(t)|$/to obtain the gain compression and phase distortion, respectively, for the RF device 12. FIGS. 2A and 2B show plots of the gain compression and phase distortion, respectively, for the model ZHL-1042 J RF amplifier 12 tested by the system of FIG. 1 using a 1 kilobit per second BPSK test stimulus. FIGS. 3A and 3B show plots of the gain compression and phase distortion, respectively, for the same amplifier using a 100 kilobit per second BPSK test stimulus. In practice, the measured gain compression and phase angle for the RF device 12 of FIG. 1 at low bit rates (e.g., 1 kilobit per second) have compared well to values obtained for these parameters by conventional RF testing using an analog carrier, demonstrating that the above-described digital test technique provides an accurate assessment of the operation of the device. From a comparison of the plots of FIGS. 2A and 3A and 2B and 3B, this particular model amplifier is more linear at 100 kilobits per second than at 1 kilobit per second. Conventional RF testing with an unmodulated carrier would be incapable of revealing that the RF device 12 was more linear at higher bit rates.

Although the test technique of the invention has been described as utilizing BPSK signals, other modulation schemes may be employed. Indeed, any modulation scheme in which the magnitude of the stimulus varies over time will produce similar results. For example, Quadrature Shift Phase Keying (QPSK) modulation and π/4 Differential Quadrature Phase Shift Keying (π/4 DQPSK) may also be employed.

In addition to providing test information unobtainable by conventional techniques, the technique of the present invention affords another distinct advantage. As compared to conventional test techniques that utilize an unmodulated RF carrier, the test technique of the invention allows for much more rapid testing.

The foregoing discloses a technique for testing a RF device 12.

It is to be understood that the above-described embodiment is merely illustrative of the principles of the invention. Various modifications and changes may be made thereto by those skilled in the art which will embody the principles of the invention and fall within the spirit and scope thereof.

What is claimed is:

1. A method for testing a RF electronic device, such as an amplifier or the like, comprising the steps of:

applying a digitally-modulated RF stimulus signal having a known time-dependent phase angle value and magnitude value, to the RF device to cause the RF device to generate a modulated RF response signal;

down-converting the RF response signal;

digitizing the down-converted RF response signal;

establishing a phase angle value and magnitude value of the digitized, down-converted RF response signal; and comparing the phase angle and magnitude values of the modulated RF stimulus signal to the phase angle and magnitude values, respectively, of the RF response signal to establish transfer functions for the RF device indicative of its operation.

2. The method according to claim 1 wherein the digitally-modulated RF stimulus comprises a binary phase shift keyed signal.

3. The method according to claim 2 wherein the binary phase shift keyed stimulus comprises a 1 kilobit per second binary signal superimposed on a 1.6 GHz carrier signal.

4. The method according to claim 2 wherein the binary phase shift keyed stimulus signal comprises a 100 kilobit per second binary signal superposed on a 1.6 GHz carrier signal.

5. The method according to claim 1 wherein a first transfer function (gain compression) is established in accordance with the ratio of the magnitude of the digitized, down-converted response signal to the magnitude of the digitally-modulated RF stimulus signal.

6. The method according to claim 1 wherein a second transfer function (phase distortion) is established in accordance with the difference between the phase angle value of the digitized, down-converted response signal to the phase angle value of the digitally-modulated RF stimulus signal.

7. Apparatus for testing an RF device comprising:

means for generating a digitally-modulated RF stimulus signal, having a known phase angle and magnitude, for input to the RF device to cause the RF device to generate an RF response signal;

means for receiving the RF response signal and for down-converting the RF response signal and digitizing the down-converted response signal; and means for establishing the magnitude and phase angle of the digitized, down-converted response signal and for comparing the magnitude and phase angle of the digitized, down-converted response signal to the magnitude and phase angle, respectively, of the digitally-modulated RF stimulus signal to establish transfer functions indicative of the operation of the RF device.

8. The apparatus according to claim 7 wherein the means for generating the digitally-modulated RF stimulus signal comprises:

a source of RF signals; and a modulator for modulating the signals from the source of RF signals.

9. The apparatus according to claim 7 wherein the receiver comprises:

a down-converter; and an analog-to-digital converter.

* * * * *